(12) United States Patent
Korngold et al.

(10) Patent No.: US 8,609,203 B2
(45) Date of Patent: Dec. 17, 2013

(54) METHOD AND APPARATUS FOR PLASMA SURFACE TREATMENT OF MOVING SUBSTRATE

(75) Inventors: Bruno Alexander Korngold, Drunen (NL); Hindrik Willem De Vries, Tilburg (NL); Eugen Aldea, Eindhoven (NL)

(73) Assignee: Fujifilm Manufacturing Europe B.V., Tilburg (NL)

( * ) Notice: Subject to any disclaimer, the term of this patent is extended or adjusted under 35 U.S.C. 154(b) by 398 days.

(21) Appl. No.: 12/996,339

(22) PCT Filed: Feb. 19, 2009

(86) PCT No.: PCT/NL2009/050073
§ 371 (c)(1),
(2), (4) Date: Jan. 6, 2011

(87) PCT Pub. No.: WO2009/148305
PCT Pub. Date: Dec. 10, 2009

(65) Prior Publication Data
US 2011/0089142 A1   Apr. 21, 2011

(30) Foreign Application Priority Data

Jun. 6, 2008   (EP) .................................... 08157745

(51) Int. Cl.
*H05H 1/24* (2006.01)
*H05H 1/00* (2006.01)
*C23C 16/00* (2006.01)

(52) U.S. Cl.
USPC ..... 427/569; 427/533; 118/723 R; 118/723 E

(58) Field of Classification Search
None
See application file for complete search history.

(56) References Cited

U.S. PATENT DOCUMENTS

| 6,827,870 | B1 * | 12/2004 | Gianchandani et al. | ........ 216/71 |
| 7,533,629 | B2 * | 5/2009 | DeVries et al. | ........... 118/723 E |
| 2004/0129220 | A1 * | 7/2004 | Saitoh et al. | ............... 118/723 E |

(Continued)

FOREIGN PATENT DOCUMENTS

| EP | 1 035 757 A1 | 9/2000 |
| EP | 1 403 902 A1 | 3/2004 |

(Continued)

OTHER PUBLICATIONS

Fuller, Lynn, "Plasma Etching", Microelectronic Engineering, Rochester Institute of Technology.*

(Continued)

*Primary Examiner* — Timothy Meeks
*Assistant Examiner* — Ina Agaj
(74) *Attorney, Agent, or Firm* — Gilberto M. Villacorta; Sunit Talapatra; Foley & Lardner LLP

(57) ABSTRACT

A method and apparatus for treatment of a substrate surface using an atmospheric pressure plasma is disclosed. The method comprises providing an atmospheric pressure plasma in a treatment space between a first electrode and a second electrode, providing a substrate in contact with the first electrode in the treatment space, and applying a plasma generating power to the first and second electrodes. The first electrode has a predefined structure of insulating areas and conductive areas for plasma treatment of surface areas of the substrate corresponding to the areas in contact with the conductive areas of the first electrode.

13 Claims, 2 Drawing Sheets

(56) References Cited

U.S. PATENT DOCUMENTS

| | | |
|---|---|---|
| 2004/0144733 A1 | 7/2004 | Cooper et al. |
| 2004/0238124 A1 | 12/2004 | Nakamura |
| 2006/0222779 A1* | 10/2006 | Gabelnick et al. ............ 427/569 |
| 2009/0102886 A1* | 4/2009 | Sieber et al. .................... 347/45 |

FOREIGN PATENT DOCUMENTS

| | | | | |
|---|---|---|---|---|
| WO | WO 01/27969 | * | 4/2001 | .............. H01J 37/32 |
| WO | WO 01/27969 A1 | | 4/2001 | |
| WO | WO 2004/019381 A2 | | 3/2004 | |
| WO | WO2008/100139 | * | 8/2008 | .............. H01J 37/32 |

OTHER PUBLICATIONS

International Search Report received in corresponding International Application No. PCT/NL2009/050073.

* cited by examiner

METHOD AND APPARATUS FOR PLASMA SURFACE TREATMENT OF MOVING SUBSTRATE

FIELD OF THE INVENTION

The present invention relates to a method for treatment of a substrate surface using an atmospheric pressure plasma, the method comprising providing an atmospheric pressure plasma in a treatment space between a first electrode and a second electrode, providing a substrate in contact with the first electrode in the treatment space, and applying a plasma generating power to the first and second electrode. In a further aspect, the present invention relates to a plasma treatment apparatus for treatment of a surface of a substrate, comprising a first cylinder drum electrode and a second electrode, a power supply connected to the first electrode and the second electrode for generating an atmospheric pressure plasma in a treatment space, wherein the substrate is in contact with the first electrode in the treatment space in operation.

PRIOR ART

International patent publication WO2004/019381 describes the process of depositing a coating on a substrate in the form of a moving web. A rotating drum is used as one of the electrodes for generating a glow discharge plasma.

European patent publication EP 1 403 902 A1 discloses a method for generating an atmospheric pressure glow discharge plasma using a dielectric barrier discharge electrode configuration. A drum shaped electrode is used, and the substrate film to be treated is guided along a part of the circumference of the drum shaped electrode.

SUMMARY OF THE INVENTION

The present invention seeks to provide an improved substrate treatment method and apparatus, which allow a substrate surface to be patterned in a continuous manner using an atmospheric pressure plasma.

According to the present invention, a method according to the preamble defined above is provided, wherein the first electrode has a predefined structure of insulating areas and conductive areas for plasma treatment of surface areas of the substrate corresponding to the areas in contact with the conductive areas of the first electrode. This allows to generate local plasma fields in the areas above the conductive areas and to treat the substrate with a pattern corresponding to the pattern of conductive areas on the first electrode. The patterns formed may be from coarse to very fine dimensions, as the first electrode surface can be processed using various techniques to obtain the pattern of insulating and conductive areas.

In a further embodiment, the atmospheric pressure plasma is an atmospheric pressure glow discharge plasma generated by controlling a power supply connected to the first and second electrode, in which a distance between the first and second electrode and the supply voltage of the power supply are chosen to allow plasma ignition only in the areas in the treatment space corresponding to the conductive areas. These process parameters allow an efficient and reliable implementation of the present method embodiments.

The first electrode comprises a rotating drum electrode in a further embodiment. The substrate is then able to move with the rotating drum electrode through the treatment space. This allows to efficiently perform a plasma treatment (i.e. exposure of areas which are conductive or not-insulated of the drum electrode to the plasma in operation) to a substrate in the form of a moving substrate or a moving web in a continuous manner, such as in roll-to-roll treatment of webs. As mentioned, the substrate may be a roll-to-roll substrate, e.g. in the form of a polymer web. Many materials used in various applications as basic material are provided as a roll-to-roll substrate. Using the present method, these may efficiently be plasma treated to obtain a semi-finished product for further production into a final product.

In a further embodiment, the method further comprises electro-wetting the substrate surface after plasma treatment. This may be accomplished using corona discharges using an additional DC supply and electrode(s). This allows to enhance the preferential wetting and sub-sequent coating of the polymer substrate even more than alone by plasma surface treatment.

The method further comprises depositing a material on the treated substrate in a further embodiment. The material is e.g. an ink selected from the group consisting of a water based ink, a conductive ink (which may comprise a metal), a gel based ink. For ink treatment, e.g. use can be made of hydrophobic/hydrophilic areas on the treated substrate. Very fine, accurate and precise defined conductive grids or patterns can be prepared on plasma treated polymer substrates using curable inks comprising metallic particles or elements which can be used for example in OLED devices, RF ID tags, logics, sensors and photovoltaics.

In a further aspect, the present invention relates to a plasma apparatus as defined in the preamble above, wherein said first electrode has a predefined structure of insulating areas and conductive areas for plasma treatment of surface areas of the substrate corresponding to the areas in contact with the conductive areas of the first electrode. In a further embodiment, the power supply is arranged to generate an atmospheric pressure glow discharge plasma, in which a distance between the first and second electrode and the supply voltage of the power supply are chosen to allow plasma ignition only in the areas in the treatment space corresponding to the conductive areas. The first electrode may comprise a rotating drum electrode. In an even further embodiment, the plasma treatment apparatus further comprising a third electrode opposing the first electrode (e.g. a wire-like electrode), the third electrode being connected to a DC power supply for electro-wetting the substrate surface after plasma treatment. The plasma treatment apparatus may be further arranged to deposit a material on the treated substrate, and the material may be an ink selected from the group consisting of a water based ink, a conductive ink, a gel based ink.

In even further aspects, the present invention also relates to use of the method or apparatus according to any one of the present embodiments for providing a surface of a substrate with a predefined pattern, e.g. to use of the method according to the present embodiments for providing a hydrophobic substrate with a predefined hydrophilic pattern or vice versa a hydrophilic substrate with a predefined hydrophobic pattern.

Sharp defined transitions may be e.g. be provided between hydrophobic and hydrophilic areas of the substrate, in which a transition length is less than 10 microns, e.g. 2 less than 2 micron or even less than 0.2 micron. Furthermore, the present invention relates to use of the method according to any of the present embodiments for etching a surface of a substrate with a predefined pattern, or to the use of the method according to any of the present embodiments for depositing material in a predefined pattern on a surface of a substrate.

The present method embodiments can be also used very efficiently for a printing application, e.g. for making conductive patterns or grids on polymer substrates using conductive inks in OLED devices.

SHORT DESCRIPTION OF DRAWINGS

The present invention will be discussed in more detail below, using a number of exemplary embodiments, with reference to the attached drawings, in which FIG. 1 shows a schematic diagram of an embodiment of a plasma treatment apparatus according to the present invention;

DETAILED DESCRIPTION OF EXEMPLARY EMBODIMENTS

Figure 1:
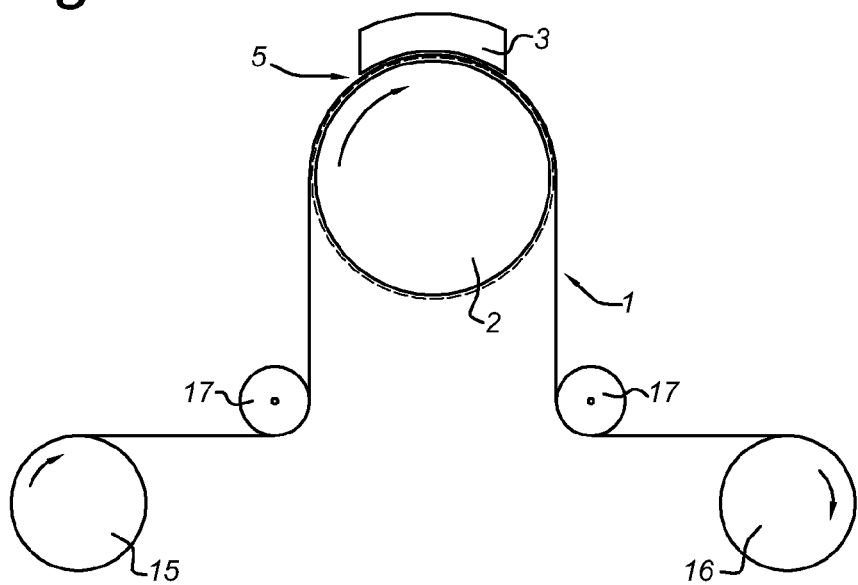

In FIG. 1 a schematic embodiment is shown of a plasma treatment apparatus for the treatment of a substrate 1 (or substrate surface) in the form of e.g. a polymeric web. The substrate 1 is a long web, which is transported from a first roll 15 over a rotating drum electrode 2 to a second roll 16, e.g. using intermediate rollers 17 to keep the substrate 1 under tension.

The plasma is generated using two electrodes 2, 3 in a dielectric barrier discharge (DBD) configuration, which as such is known to the skilled person. In this embodiment, the first electrode 2 in the form of a cylindrical drum electrode is connected to a plasma generation unit 11. A second electrode 3 is formed by a flat curved electrode following the curvature of the cylindrical drum surface of the first electrode 2 at a predetermined distance g (see description of FIG. 2 below), which also is connected to the plasma generation unit 11. The width of the second electrode 3 substantially corresponds to the width of the web 1 to be treated, or is somewhat wider.

The rotating drum electrode 2 has a predefined pattern of conductive areas 8 and insulating areas 7 which enables the structuring of the plasma generated in the treatment space 5 between the two electrodes 2, 3. This is shown in the enlarged sectional view of a part of the electrodes 2, 3 of FIG. 2. Only at the area corresponding to the conductive areas 8 on the drum electrode 2 a plasma will be formed for the treatment of substrate 1. In the cross sectional view of FIG. 2, an embodiment is shown, in which the substrate 1 forms a dielectric barrier on top of the patterned electrode 2. Also, the second electrode 3 is provided with a dielectric barrier 4. This allows to generate a well defined plasma in the treatment space 5, e.g. in the form of an atmospheric pressure glow discharge (APG) plasma, as indicated by the shaded areas in the treatment space corresponding to the conductive areas 8.

The insulating areas 7 may be formed by using one of a number of alternative processes, such as drilling, milling, etching, etc. the surface of a cylindrical drum electrode 2. The depth of the insulating areas 7 should be sufficient to prevent ignition of a plasma in the corresponding area in the treatment space 5. In an embodiment, the openings made by drilling, milling, etching, etc., are refilled with e.g. an acrylate solution and cured, in order to obtain a smooth surface of the rotating drum electrode 2. These production methods of the rotating drum electrode 2 allow to make a surface with a range from coarse (order of centimeters) to very fine features (order of 10 μm), allowing to produce treated substrates 1 with similar coarse to very fine features, as e.g. usable in producing printed polymer or organic electronics.

The plasma control unit 11 e.g. comprises a power supply and associated control circuitry as described in the pending international patent application PCT/NL2006/050209, and European patent applications EP-A-1381257, EP-A-1626613 of applicant, which are herein incorporated by reference.

Further the electrode 2 may have a temperature control (not shown here) to control the substrate temperature.

The plasma generation unit 11 is arranged to generate a uniform atmospheric pressure glow discharge plasma in the treatment space 5 between first and second electrode 2, 3. The applied voltage is adjusted such that ignition voltage is exceeded in areas in the treatment space 5 corresponding to the conductive areas 8, whereas the ignition voltage is not reached in the areas of the treatment space 5 corresponding to the insulating areas 7.

The voltage $V_a$ needed to apply to the electrodes 2, 3 in order to ignite a plasma in the treatment space 5 is equal to $V_a = V_{ig} + V_d + V_{nca}$, in which $V_{ig}$ is the (local) voltage necessary to ignite a plasma, $V_d$ is the voltage drop over the dielectric barrier (subtstrate 1 and/or dielectric barrier 4), and $V_{nca}$ is the additional voltage drop over the non-conducting (insulating) areas. If the applied voltage $V_a$ is chosen to allow plasma ignition in the areas corresponding to the conductive areas 8 ($V_{nca}=0$) but not in the areas corresponding to the insulating areas ($V_{nca}>>0$), a structured application of plasma treatment of the substrate 1 is possible.

This may e.g. be applied in the manufacturing of printed electronics as one of the processing steps, e.g. to make parts of the surface of the web 1 hydrophilic or hydrophobic. Also, with appropriate gas supply means, the local plasma in the treatment space 5 may be used to deposit substances on the exposed parts of the surface of the substrate 1.

Using the APG plasma, the treatment space 5 may be supplied with various gasses and compounds. These include, but are not limited to $N_2$, $NH_3$, $O_2$, $CO_2$ for hydrophilic treatment of a substrate 1, or $CF_4/H_2$ or plasma polymerized HMDSO (ppHMDSO) for hydrophobic treatment of a substrate 1.

Although the embodiment described above mentions the use of a DBD electrode structure for generating an atmospheric pressure glow discharge plasma, any plasma may be used to treat the surface of the web 1 as desired, e.g. using an inductively coupled plasma (ICP) generation.

Figure 2:
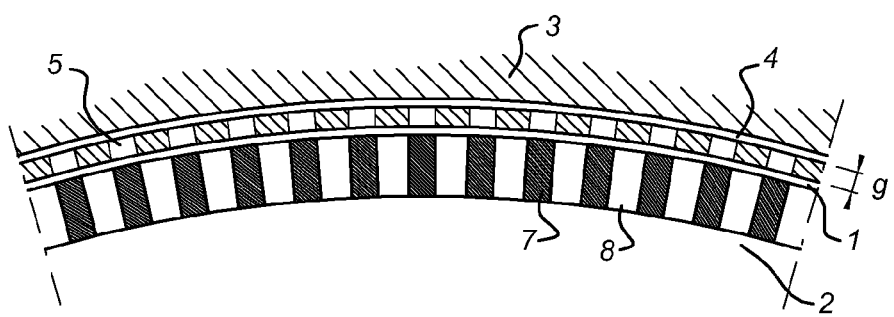
FIG. 2 shows a schematic diagram of a further embodiment according to the present invention, illustrating details of the electrodes section.

The DBD structure of the apparatus according to FIG. 1 is enhanced by using a further dielectric barrier 4 on the surface of the second electrode 3 directed towards the treatment space 5 as shown in the embodiment of FIG. 2. This will enhance the generation of a stable plasma in the treatment space 5 and may help in providing a stable and uniform glow discharge plasma in case this is needed.

In an embodiment where a glow discharge plasma may be used advantageously the formation of a glow discharge plasma may be stimulated by controlling the displacement current using a plasma control unit 11 connected to the electrodes 2, 3 (see FIGS. 1 and 2), and by controlling the distance g between electrodes 2, 3.

Figure 3:
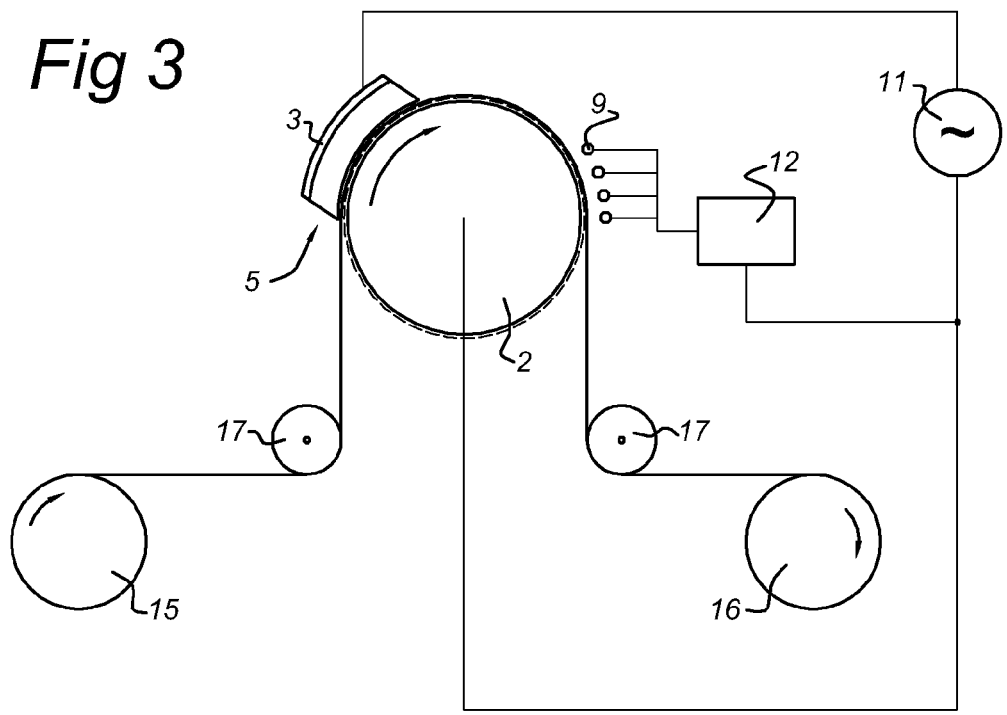
FIG. 3 shows a schematic diagram of another embodiment showing a further embodiment according the present invention illustrating the electro-wetting process.

In an embodiment the plasma treated substrate 1 may be printed or coated with metal comprising curable ink in order to obtain a fine defined conductive pattern or grid on the plasma treated substrate 1 after printing and curing the ink In a further embodiment the surface of the treated substrate 1 may be electro-wetted as after-treatment to the plasma treatment, e.g. using the apparatus as is shown in FIG. 3. This may be done for example by applying a third electrode 9 (a wire-like electrode comprising one or more conductive wires in the vicinity of the drum electrode 2 connected to a DC high voltage power supply 12 for generating a positive or negative corona in the vicinity of the wires 9. From this corona electrical charge is transported to the substrate 1 related to the conductive areas 8 of the plasma treatment. The DC high voltage power supply 12 is then controlled such that charge transfer only happens to parts of the substrate 1 which are in contact with the conductive areas 8 on the first electrode 2. Although this corona after-treatment may be done in a separate process, preferably the charge deposition is carried out directly after the localized plasma treatment on the substrate 1. In the arrangement as shown in FIG. 3, this is accomplished using the second electrode and wires 9 with the same rotating drum electrode 2.

The effect is that the substrate 1 is not only plasma treated (e.g. to make a polymeric substrate 1 hydrophobic or hydrophilic), but also electro-wetted. This allows to subsequently coat the polymer substrate 1.

EXAMPLE(S)

A cyclic olefin polymer (COP) substrate roll 1 (optical grade Topas 0.1 mm thick and 17.8 cm width) was used in the surface treatment line as shown in FIG. 1 to pattern small hydrophilic spots. The total working length of the plasma discharge in the treatment space 5 is typically 20 cm. The typical gap distance between electrodes 2 (including the dielectric) and 3 is 1 mm. Line speed of operation was typically 1 m/min.

A stainless steel drum electrode with a wall thickness of 3 mm is used. The drum electrode was patterned by laser ablation resulting in an array of 20 by 20 pins of about 300 micron diameter and about 0.5 mm deep on the drum electrode. The area between the pins were filled again with an acrylate and cured to enable a smooth surface of the drum electrode. The filled area represent the dielectric insulating areas 7 of the drum electrode, the metallic (pin) areas of the drum electrode 2 represent the conductive areas 8.

Gas mixture of Ar 5 slm, $N_2$ 2 slm and $O_2$ 0.5 slm was used. Excitation frequency of the plasma was typically 140 kHz. In order to control the stability of the APG plasma in the treatment space a displacement current control was applied (dynamic matching).

Figure 4:
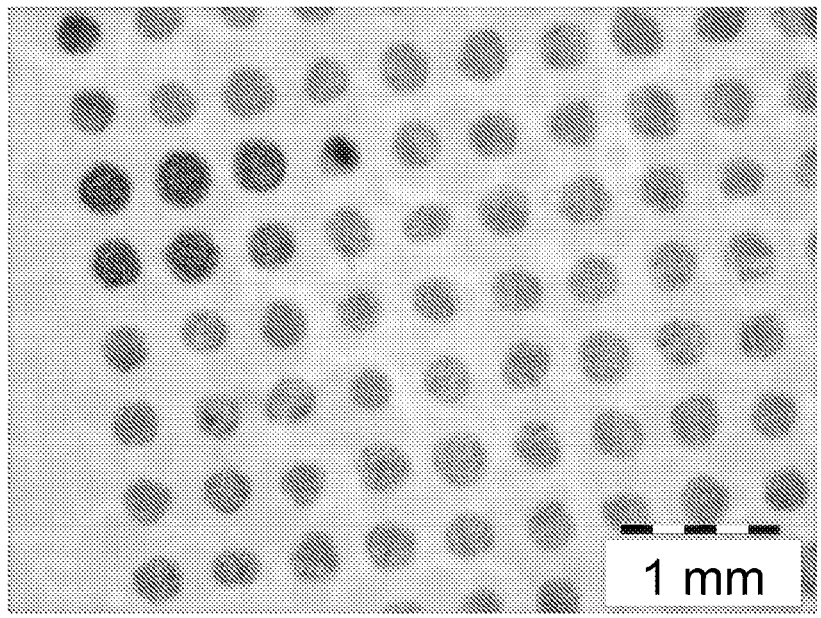
FIG. 4 shows a picture of a typical result of an embodiment after printing and curing a plasma patterned substrate with an ink.

After plasma treatment the roll substrate 1 was gravure coated with a water based curable ink containing silver-particles. FIG. 4 is showing a print of the substrate 1 after plasma, inking and curing. It is clear that the predefined pattern of the drum electrode 2 after plasma treatment and after inkjet printing and curing can be accurately reproduced on the substrate 1. As normal inkjet applications do not have such accurate reproduction (i.e. in the micron scale) the new method can be used advantageously in the applications for making conductive grids accurately and effectively on polymer substrates 1 at high line speeds continuously using a moving web especially for use in OLED devices.

The above examples and embodiments are provided to illustrate the details and workings of the embodiments of the present invention. However, the person skilled in the art will understand that alternatives are possible, e.g. elements of the embodiments may be replaced by equivalent elements resulting in similar effects. The scope of protection is not limited to the embodiments discussed and illustrated, but by the terms of the claims as appended.

The invention claimed is:

1. A method for treatment of a substrate surface, comprising:
   (a) providing atmospheric pressure plasma in a treatment space between a first rotating drum electrode and a second electrode,
   (b) contacting the substrate with the first electrode within the treatment space, and
   (c) applying a plasma generating power to the first and second electrodes,
   wherein the first electrode has a predefined structure of insulating areas and conductive areas for plasma treatment of surface areas of the substrate corresponding to the areas in contact with the conductive areas of the first electrode.

2. The method of claim 1, wherein the atmospheric pressure plasma is an atmospheric pressure glow discharge plasma generated by controlling a power supply connected to the first and second electrode, in which a distance between the first and second electrode and the supply voltage of the power supply are chosen to allow plasma ignition only in the areas in the treatment space corresponding to the conductive areas.

3. The method of claim 1, further comprising electro-wetting the substrate surface after plasma treatment.

4. The method of claim 1, further comprising depositing a material on the treated substrate.

5. The method of claim 4, in which the material is an ink selected from the group consisting of a water based ink, a conductive ink, a gel based ink.

6. The method of claim 1, wherein the treatment provides the surface of a substrate with a predefined pattern.

7. A method of printing conductive patterns or grids on a substrate, comprising:
   (a) providing atmospheric pressure plasma in a treatment space between a first rotating drum electrode and a second electrode,
   (b) contacting the substrate with the first electrode within the treatment space, and
   (c) applying a plasma generating power to the first and second electrodes,
   wherein the first electrode has a predefined structure of insulating areas and conductive areas for plasma treatment of surface areas of the substrate corresponding to the areas in contact with the conductive areas of the first electrode.

8. The method of claim 7, wherein the substrate is a polymeric substrate.

9. The method of claim 1, wherein the substrate forms a dielectric barrier on the first electrode.

10. The method of claim 1, wherein the second electrode is in contact with a dielectric barrier.

11. The method of claim 1, wherein substrate forms a first dielectric barrier on the first electrode, and wherein the second electrode is in contact with a second dielectric barrier.

12. The method of claim 1, wherein the substrate forms a first dielectric barrier on the first electrode, wherein the second electrode is in contact with a second dielectric barrier, and wherein the first dielectric barrier and the second dielectric barrier is separated by a distance.

13. The method of claim 1, wherein the substrate contacts both the insulating area and the conductive area of the first electrode.

* * * * *